(12) United States Patent
Lee (10) Patent No.: US 7,454,179 B1
(45) Date of Patent: Nov. 18, 2008

(54) RADIO FREQUENCY POWER DETECTOR AND DECISION CIRCUIT USED WITH DC SUPPLY VOLTAGE CONTROLLED POWER AMPLIFIERS

(75) Inventor: Jongsoo Lee, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 555 days.

(21) Appl. No.: 11/273,739

(22) Filed: Nov. 15, 2005

(51) Int. Cl.
*H01Q 11/12* (2006.01)

(52) U.S. Cl. .............. 455/127.1; 455/115.1; 455/115.3; 455/67.11; 455/343.1; 375/295; 375/297; 330/127; 330/129; 330/136; 330/140; 324/707

(58) Field of Classification Search ............ 455/343.1, 455/115.1, 115.3, 115.4, 116, 127.1–127.3, 455/67.11; 375/295, 297; 330/127, 129, 330/136, 140, 250, 278; 324/707, 771, 127, 324/312, 314; 329/350, 351
See application file for complete search history.

(56) References Cited

U.S. PATENT DOCUMENTS

| | | | | |
|---|---|---|---|---|
| 4,633,512 A * | 12/1986 | Kyrian | ........................ | 455/108 |
| 5,303,395 A * | 4/1994 | Dayani | ........................ | 455/571 |
| 5,423,081 A | 6/1995 | Thiele et al. | ................ | 455/116 |
| 5,955,921 A * | 9/1999 | Ide et al. | ...................... | 330/254 |
| 6,430,402 B1 | 8/2002 | Agahi-Kesheh | ............. | 455/115 |
| 6,442,378 B1 * | 8/2002 | Aboukhalil et al. | ...... | 455/115.3 |
| 6,624,702 B1 | 9/2003 | Dening | ........................ | 330/297 |
| 6,639,471 B2 | 10/2003 | Matsuura et al. | ............ | 330/302 |
| 6,690,237 B2 | 2/2004 | Miyazawa | ................... | 330/285 |
| 6,735,419 B2 | 5/2004 | Mitzlaff | .................... | 455/127.1 |
| 6,774,725 B2 | 8/2004 | Miki et al. | ................... | 330/297 |
| 6,788,151 B2 | 9/2004 | Shvarts et al. | ................ | 330/297 |
| 6,828,859 B2 * | 12/2004 | Dupuis | ....................... | 330/279 |
| 6,831,517 B1 | 12/2004 | Hedberg et al. | ............. | 330/285 |
| 2004/0242170 A1 * | 12/2004 | Gilbert | ..................... | 455/127.1 |
| 2007/0063684 A1 * | 3/2007 | Adragna et al. | ............. | 323/284 |

OTHER PUBLICATIONS

N. Schlumpf et al., "A fast modulator for dynamic supply linear RF power amplifier," IEEE J. Solid State Circuits, vol. 39, No. 7, pp. 1015-1025, Jul. 2004.
B. Sahu et al., "System-Level Requirements of DC-DC Converters for Dynamic Power Supplies of Power Amplifiers," IEEE MTT-S, pp. 149-152, 2002.

* cited by examiner

*Primary Examiner*—Edward Urban
*Assistant Examiner*—Junpeng Chen
(74) *Attorney, Agent, or Firm*—Withrow & Terranova, P.L.L.C.

(57) ABSTRACT

The present invention is an active RF power detector and decision circuit, which is used to provide a DC signal to circuitry that controls the DC supply voltage to an RF power amplifier. The DC signal is proportional to the amount of RF power detected within specified operating limits. When the RF power detected is above the maximum operating limit, the DC signal is set to its maximum value. When the RF power detected is below the minimum operating limit, the DC signal is set to its minimum value. The active RF power detector and decision circuit does not require an external DC reference voltage. Since the active RF power detector and decision circuit uses active components, the input impedance is high enough to use resistors to couple the RF input signal instead of a lower impedance RF coupler and the response time is faster than a passive envelope detector.

20 Claims, 13 Drawing Sheets

RADIO FREQUENCY POWER DETECTOR AND DECISION CIRCUIT USED WITH DC SUPPLY VOLTAGE CONTROLLED POWER AMPLIFIERS

FIELD OF THE INVENTION

The present invention relates to Radio Frequency (RF) power detectors and decision circuits used in RF communications circuitry, which is used in communications systems.

BACKGROUND OF THE INVENTION

RF power amplifiers are commonly used in RF circuits as the last active stage in RF transmitters. As a result, an RF power amplifier is typically the largest power consumption device in an RF system; therefore, RF power amplifier systems are designed to be as efficient as possible. One commonly used technique for improving the efficiency of an RF power amplifier is to feed the DC supply voltage of the RF power amplifier with a DC to DC converter, such that the DC supply voltage is adjusted to allow the RF power amplifier to amplify the RF signals to be amplified properly in an efficient manner.

For the DC to DC converter to output the appropriate DC supply voltage, it must be provided with an input signal representative of the desired output voltage, which is determined from the magnitude of the RF signals being amplified. By using an RF power detector, the magnitude of the RF signals can be measured.

Figure 1:
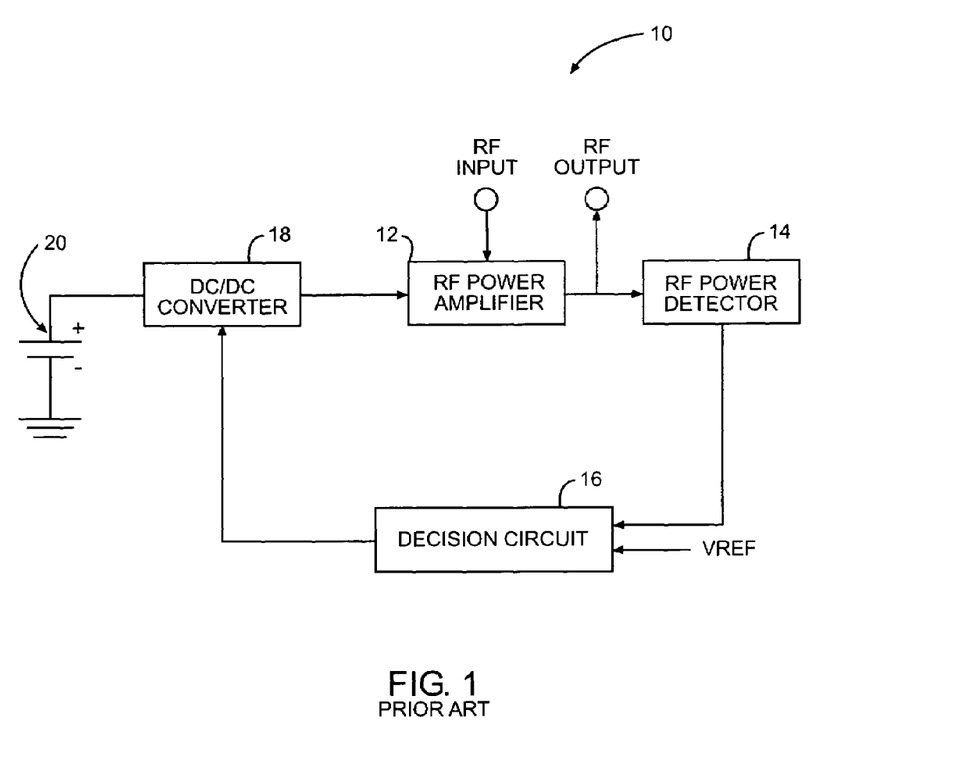
FIG. 1 shows how an RF power detector and decision circuit are used with a DC to DC converter and RF power amplifier, which is one example of prior art.

FIG. 1 shows a typical RF power amplifier system using a DC to DC converter 10. The RF output of an RF power amplifier 12 is coupled into an RF power detector 14, which creates a DC voltage representation of the detected RF signal, which is then fed into a decision circuit 16. The decision circuit 16 then creates a control voltage for a DC to DC converter 18 using the signal from the RF power detector 14 and a stable, accurate DC reference voltage, called VREF. The DC to DC converter 18 is powered from a DC supply 20, which may be a battery.

Figure 2:
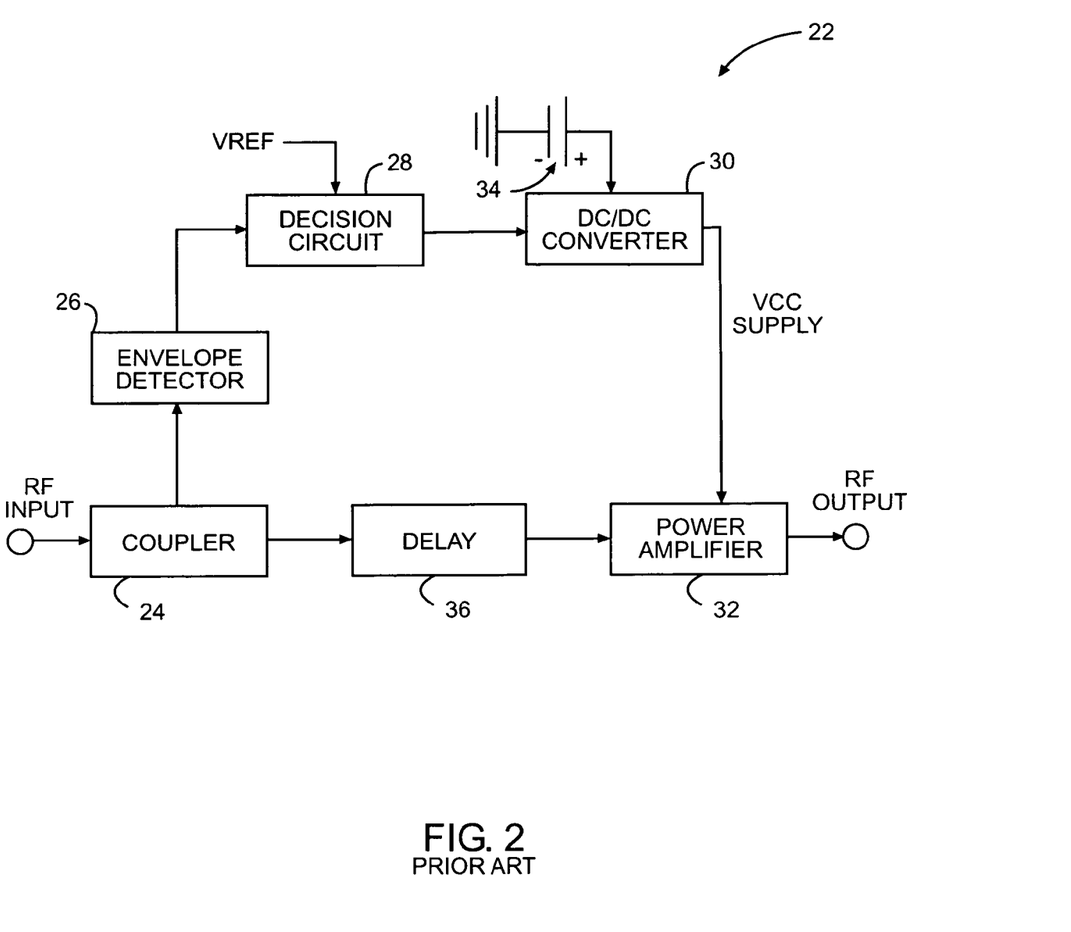
FIG. 2 shows how an RF envelope power detector and decision circuit are used with a DC to DC converter and RF power amplifier, which is another example of prior art.

FIG. 2 shows an RF power amplifier system 22 including a delay circuit. The RF input to an RF power amplifier stage is fed into an RF coupler 24, which extracts some of the RF signal to feed an RF envelope detector 26. The RF envelope detector 26 creates a DC representation of the RF input signal to be used by a decision circuit 28, which creates a control voltage for a DC to DC converter 30 using the signal from the RF envelope detector 26 and a stable, accurate DC reference voltage, called VREF. The DC to DC converter 30 provides the controlled DC supply voltage, called VCC SUPPLY, to an RF power amplifier 32. The DC to DC converter 30 is powered from a DC supply 34, which may be a battery. It is common for RF envelope detectors to introduce some delay in converting an RF signal into a DC representation; therefore, a delay network 36 may be needed in the RF signal path between the RF coupler 24 and the RF power amplifier 32 to preserve the linearity of the RF power amplifier 32. If a delay network 36 is needed, then the RF coupler 24 must be connected to the RF input instead of the RF output of the RF power amplifier system to compensate for the delay in the RF envelope detector 26.

Figure 3:
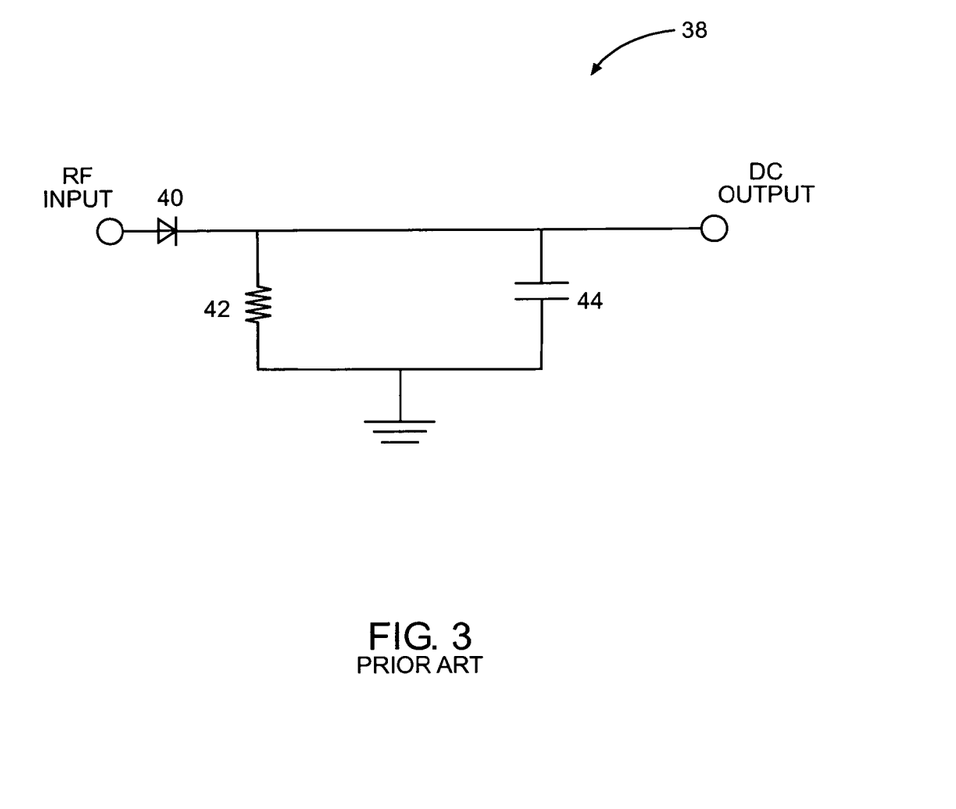
FIG. 3 shows the details of the RF envelope detector from FIG. 2.

A typical envelope detector circuit 38 is shown in FIG. 3. The RF input signal is fed through a diode 40 into a parallel resistor 42 and capacitor 44. The DC output is taken from the parallel resistor 42 and capacitor 44.

Figure 4:
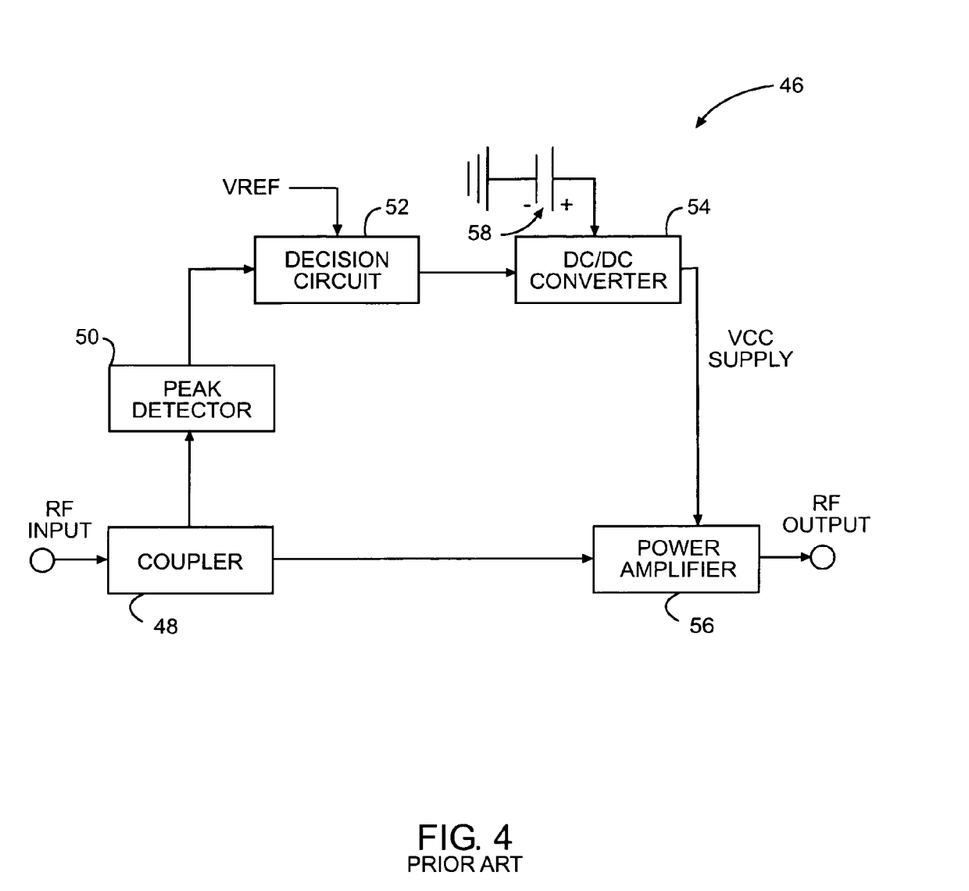
FIG. 4 shows how an RF peak power detector and decision circuit are used with a DC to DC converter and RF power amplifier, which is another example of prior art.

FIG. 4 shows an RF power amplifier system 46 without delay. RF peak detectors respond only to the peak levels of RF signals rather than the envelope of RF signals. The RF input to an RF power amplifier stage is fed into an RF coupler 48, which extracts some of the RF signal to feed an RF peak detector 50. The RF peak detector 50 creates a DC representation of the RF input signal to be used by a decision circuit 52, which creates a control voltage for a DC to DC converter 54 using the signal from the RF peak detector 50 and a stable, accurate DC reference voltage, called VREF. The DC to DC converter 54 provides the controlled DC supply voltage, called VCC SUPPLY, to an RF power amplifier 56. The DC to DC converter 54 is powered from a DC supply 58, which may be a battery. Unlike typical RF envelope detectors, RF peak detectors may not introduce delay in converting an RF signal into a DC representation; therefore, the RF coupler 48 may be connected directly to the RF power amplifier 56.

RF peak detectors can have difficulty operating with small signal levels or in systems using phase modulation where phase changes can introduce low peak levels of RF signals such that information can be lost; therefore, they may not be acceptable for use in certain applications.

One desirable characteristic in a DC to DC converter based RF power amplifier system is to provide both minimum and maximum operating limits for the DC supply voltage to an RF power amplifier. A maximum operating limit makes sure the RF output power from an RF power amplifier does not exceed required levels so that regulatory requirements, such as those imposed by the FCC, thermal limits, and power consumption limits are met. A minimum operating limit makes sure an RF power amplifier has adequate DC supply voltage to operate properly and satisfying linearity requirements of communications standards. Typically the minimum operating limit is established by a stable, accurate DC reference voltage feeding the decision circuit. When RF input signals fall below the level established by the DC reference voltage, the DC supply voltage is maintained at its minimum level. Reference voltage circuits typically require complementary transistor technology to implement, such as both n-type and p-type, which restricts the type of technologies that can be used.

An RF coupler has the characteristic of extracting some of the RF signal from a signal path, which could provide undesirable loading of RF circuits feeding the RF coupler.

SUMMARY OF THE INVENTION

The present invention is an active RF power detector and decision circuit, which is used to provide a DC signal to circuitry that controls the DC supply voltage to an RF power amplifier. The DC signal is proportional to the amount of RF power detected within specified operating limits. When the RF power detected is above the maximum operating limit, the DC signal is set to its maximum value. When the RF power detected is below the minimum operating limit, the DC signal is set to its minimum value. The active RF power detector and decision circuit does not require an external DC reference voltage. Since the active RF power detector and decision circuit uses active components, the input impedance is high enough to use resistors to couple the RF input signal instead of a lower impedance RF coupler and the response time is faster than a passive envelope detector.

The present invention is comprised of a resistor attenuated input feeding two amplifier and detector circuits. One amplifier and detector circuit is non-inverting and has a transfer function with a positive slope. The other amplifier and detector circuit is inverting and has a transfer function with a negative slope. The two amplifier and detector circuits feed a differential input decision circuit, which provides an output signal used to control the output voltage of a DC to DC converter. By using the two amplifier and detector circuits, a DC reference voltage is not required; therefore, no DC reference voltage generator circuitry is required.

Since DC reference voltage generator circuits typically use p-type transistors, many implementations of decision circuits have been limited to technologies that support both n-type and p-type transistors; however, by eliminating the DC reference voltage, the present invention can be implemented with technologies that have relatively limited capability for p-type transistors, such as Gallium Arsenide (GaAs) technology. A power detector and decision circuit could be integrated with a GaAs power amplifier on a single GaAs die.

Since the input impedance of the RF power detector is relatively high, the RF signals being amplified by the RF power amplifier can be measured at either the output of the RF power amplifier or the input of the RF power amplifier. By measuring the RF signals at the input of the power amplifier, external loading variations at the output of the RF power amplifier will have minimal effect on the measurement; however, the gain of the RF power amplifier must be included when determining the operating levels of the DC to DC converter.

Since the power detection is done with active circuitry, delays in converting RF input signals into DC representations of RF power are minimized. The present invention can be implemented using any transistor technology such as Metal Oxide Semiconductor Field Effect Transistor (MOSFET) technology, Junction Field Effect Transistor (JFET) technology, or bipolar technology. Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE INVENTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 5:
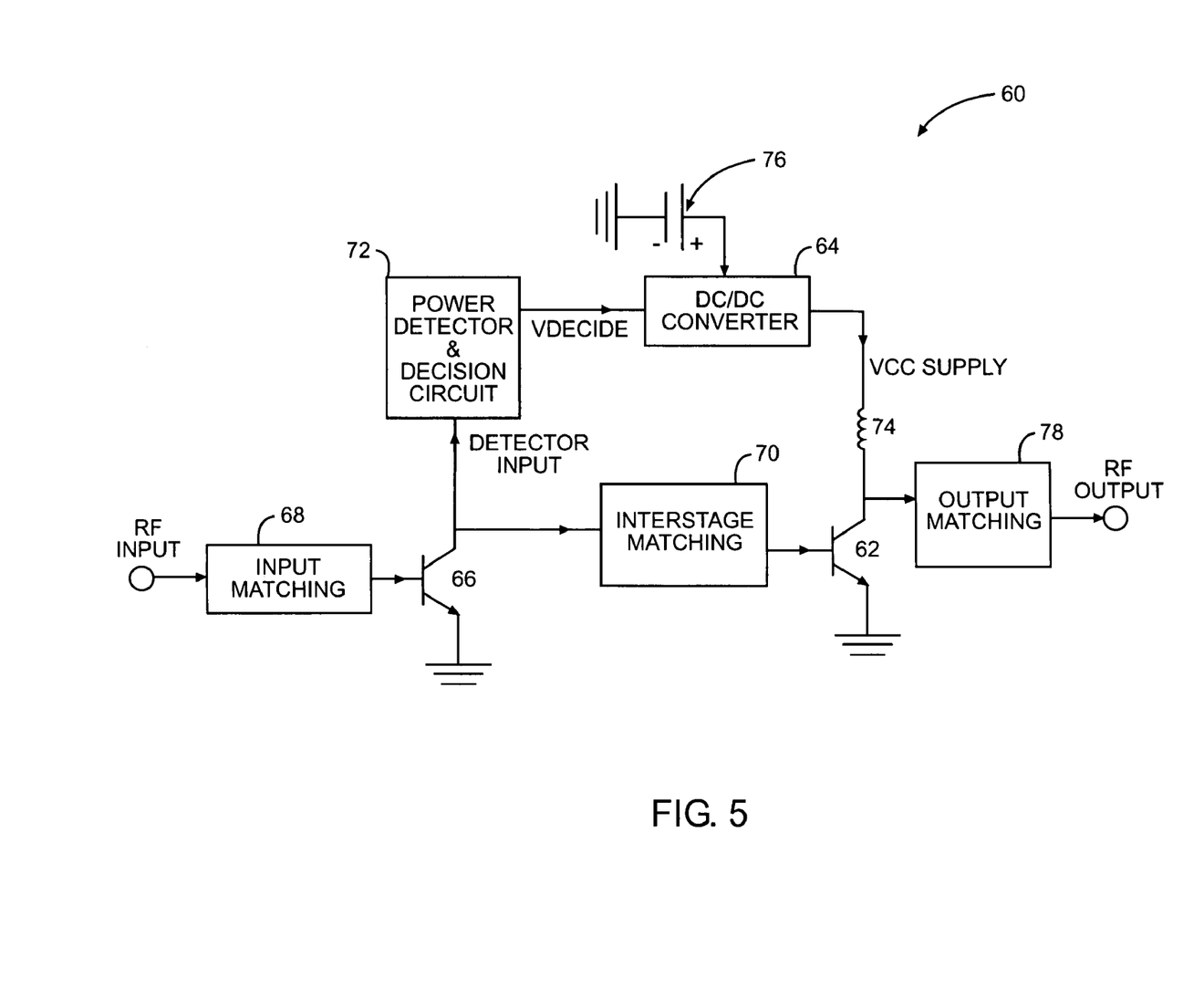
FIG. 5 shows the present invention used in a two stage amplifier design with a DC to DC converter.

As shown in FIG. 5, one embodiment of the present invention is a two stage power amplifier 60 in which the DC supply voltage to the final stage 62 is controlled by a DC to DC converter 64, and RF power is detected at the output of the first stage 66 as shown in FIG. 5. The RF input feeds an input matching network 68, which then feeds the first stage 66. The output of the first stage 66 then feeds an interstage matching network 70 and a power detector and decision circuit 72, which detects the RF power from the first stage 66 and generates a DC control voltage, called VDECIDE, for the DC to DC converter 64. The DC to DC converter 64 provides the DC supply voltage, called VCC SUPPLY, to the final stage 62 through a filter inductor 74. The DC to DC converter 64 is powered from a DC supply 76, which may be a battery. The interstage matching network 70 feeds the final stage 62 which drives the RF output through an output matching network 78.

Figure 6:
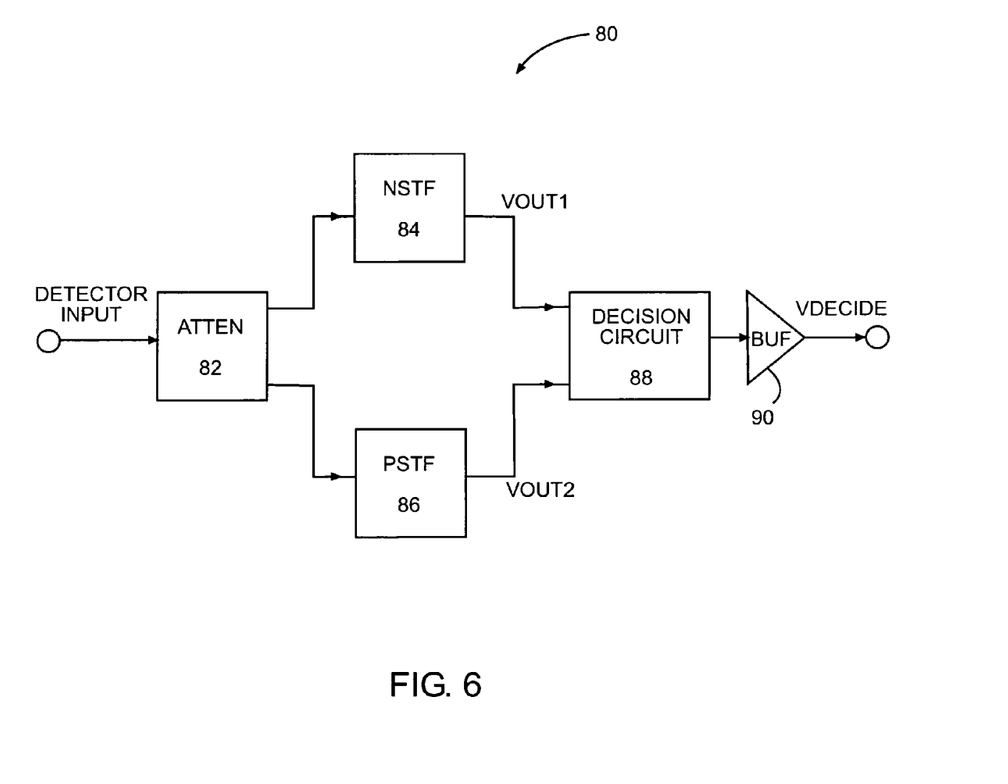
FIG. 6 shows a block diagram of the present invention.
Figure 7:
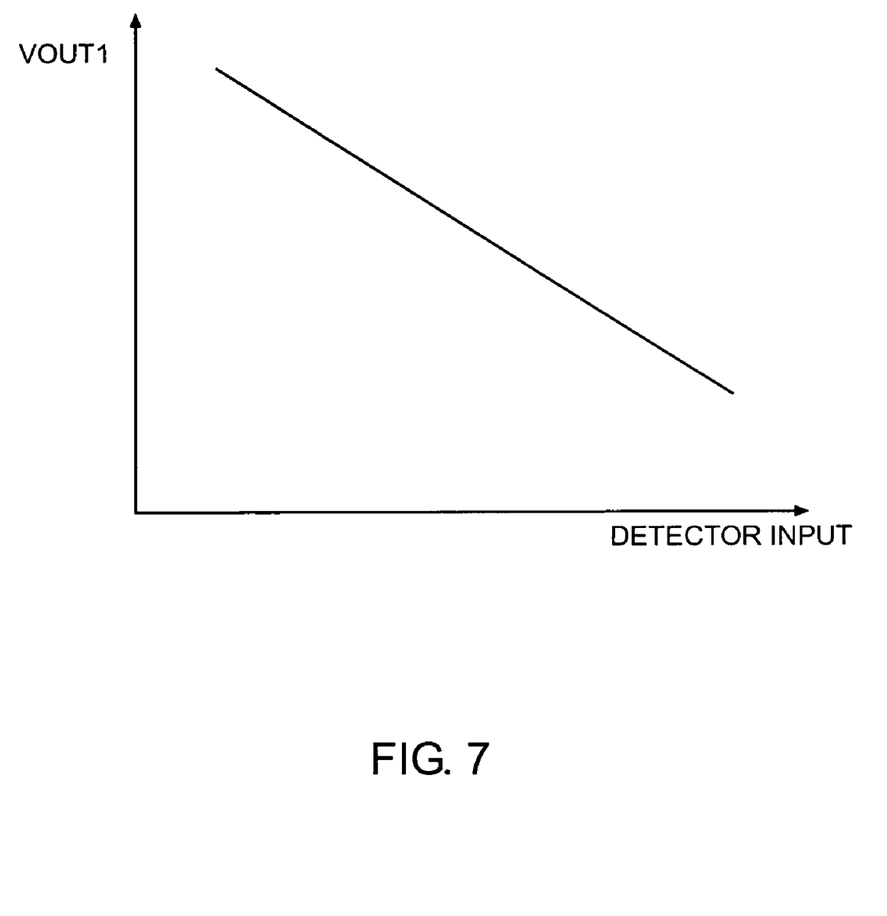
FIG. 7 shows the output response of the inverting amplifier and detector elements used in the present invention.
Figure 8:
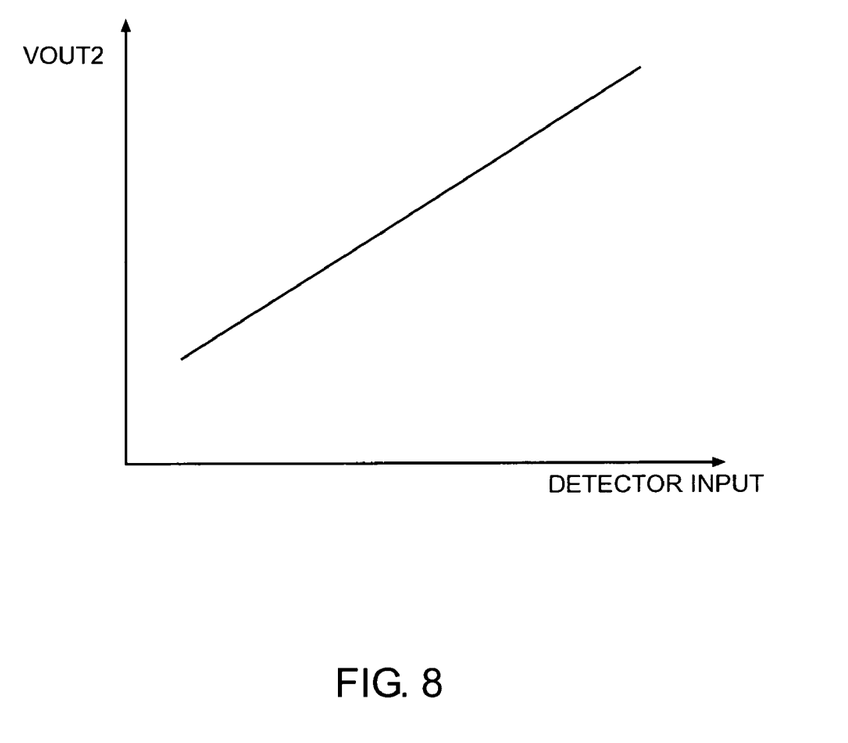
FIG. 8 shows the output response of the non-inverting amplifier and detector elements used in the present invention.

Another embodiment of the invention is a buffered power detector and decision circuit 80, as shown in FIG. 6. A detector input to the buffered power detector and decision circuit 80 feeds a resistor attenuator (ATTEN) 82, which then feeds two amplifier and detector circuits. The first amplifier and detector circuit is a negative slope transfer function inverting amplifier (NSTF) 84, which provides a DC output called VOUT1. The second amplifier and detector circuit is a positive slope transfer function non-inverting amplifier (PSTF) 86, which provides a DC output called VOUT2. The negative slope transfer function amplifier 84 has a transfer function with a negative slope as shown in FIG. 7. The positive slope transfer function amplifier 86 has a transfer function with a positive slope as shown in FIG. 8. The two amplifier and detector circuits feed a differential decision circuit 88, which creates a DC signal suitable for driving a DC to DC converter. The DC signal is then fed through a buffer 90 (BUF) to create VDECIDE.

Figure 9:
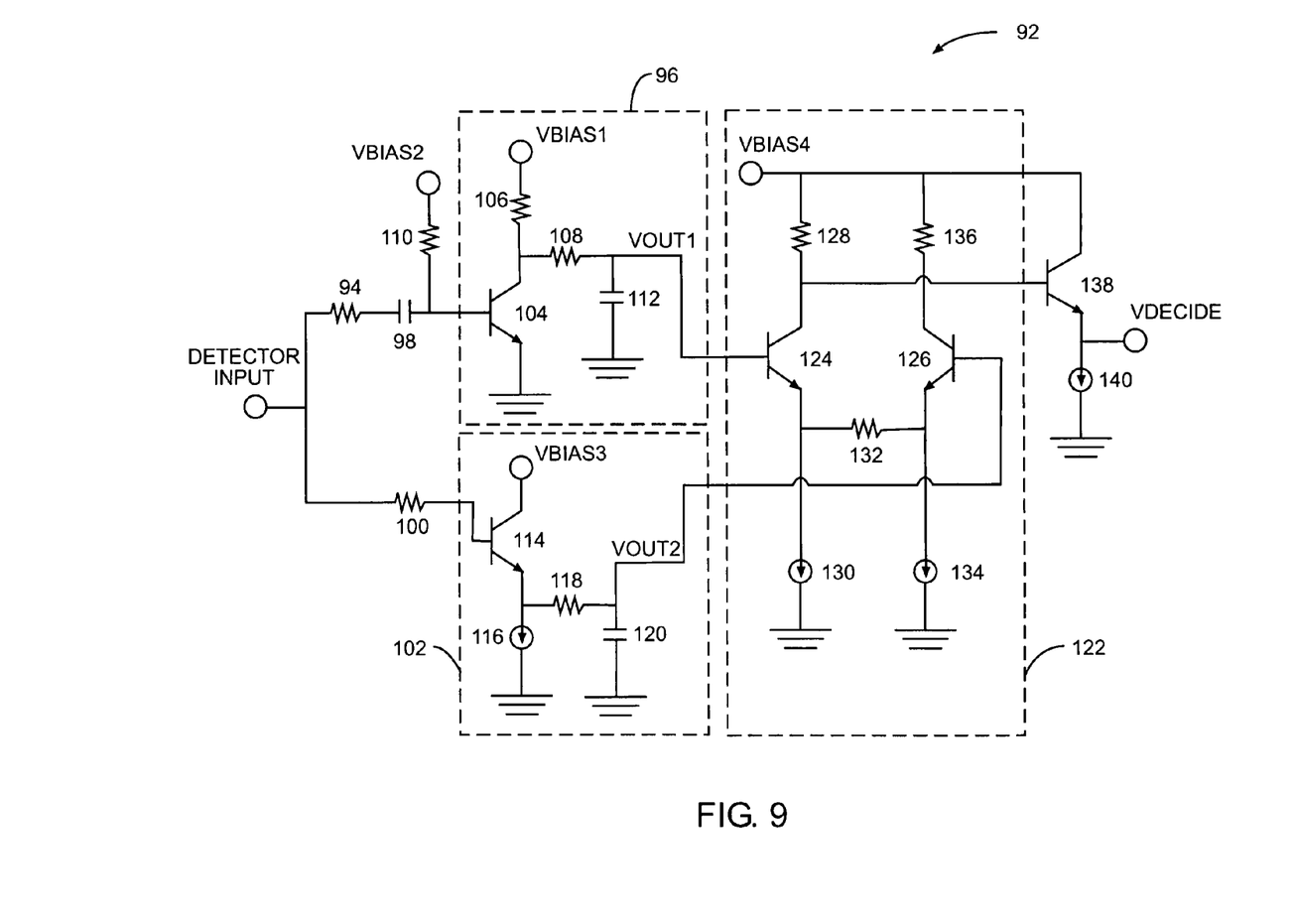
FIG. 9 shows a schematic diagram of the present invention.

Another embodiment of the invention is a bipolar power detector and decision circuit 92 as shown in FIG. 9. The detector input feeds two attenuator resistors. A first attenuator resistor 94 feeds a common emitter amplifier 96 through a coupling capacitor 98. A second attenuator resistor 100 feeds a common collector amplifier 102. The resistance values of the resistors can be relatively high to minimize loading of the detector input. The resistor values may be greater than 500 ohms.

The common emitter amplifier 96 is comprised of a common emitter amplifier transistor 104 whose collector drives a common emitter amplifier load resistor 106 and a common emitter amplifier filter resistor 108. The common emitter amplifier load resistor 106 is connected to a DC supply voltage, called VBIAS1. The base of the common emitter amplifier transistor 104 is connected to a DC bias voltage, called VBIAS2, through a common emitter amplifier bias resistor 110. The common emitter amplifier filter resistor 108 feeds a common emitter amplifier filter capacitor 112, which provides the common emitter amplifier 96 DC output signal, called VOUT1. The common emitter amplifier filter resistor 108 and the common emitter amplifier filter capacitor 112 filter the RF signal to create the DC output signal.

The common collector amplifier 102 is comprised of a common collector amplifier transistor 114 whose emitter drives a common collector amplifier current source 116 and a common collector amplifier filter resistor 118. The collector of the common collector amplifier transistor 114 is connected to a DC supply voltage, called VBIAS3. The common collector amplifier filter resistor 118 feeds a common collector amplifier filter capacitor 120, which provides the common collector amplifier 102 DC output signal, called VOUT2. The common collector amplifier filter resistor 118 and the common collector amplifier filter capacitor 120 filter the detector input signal to create the DC output signal.

VOUT1 and VOUT2 feed the inputs of a bipolar differential decision circuit 122, which is comprised of a primary side and a secondary side. VOUT1 feeds the base of a primary side transistor 124 and VOUT2 feeds the base of a secondary side transistor 126. The collector of the primary side transistor 124 drives a primary side load resistor 128 and provides the output from the bipolar differential decision circuit 122. The primary side load resistor 128 is connected to a DC supply voltage, called VBIAS4. The emitter of the primary side transistor 124 is connected to a primary side current source 130 and a common emitter resistor 132. The other end of the common emitter resistor 132 is connected to a secondary side current source 134 and the emitter of the secondary side transistor 126. The collector of the secondary side transistor 126 drives a secondary side load resistor 136, which is connected to VBIAS4. The output from the bipolar differential decision circuit 122 drives a common collector buffer amplifier comprising a buffer transistor 138 and a buffer current source 140. The emitter of the buffer transistor 138 provides VDECIDE.

Figure 10:
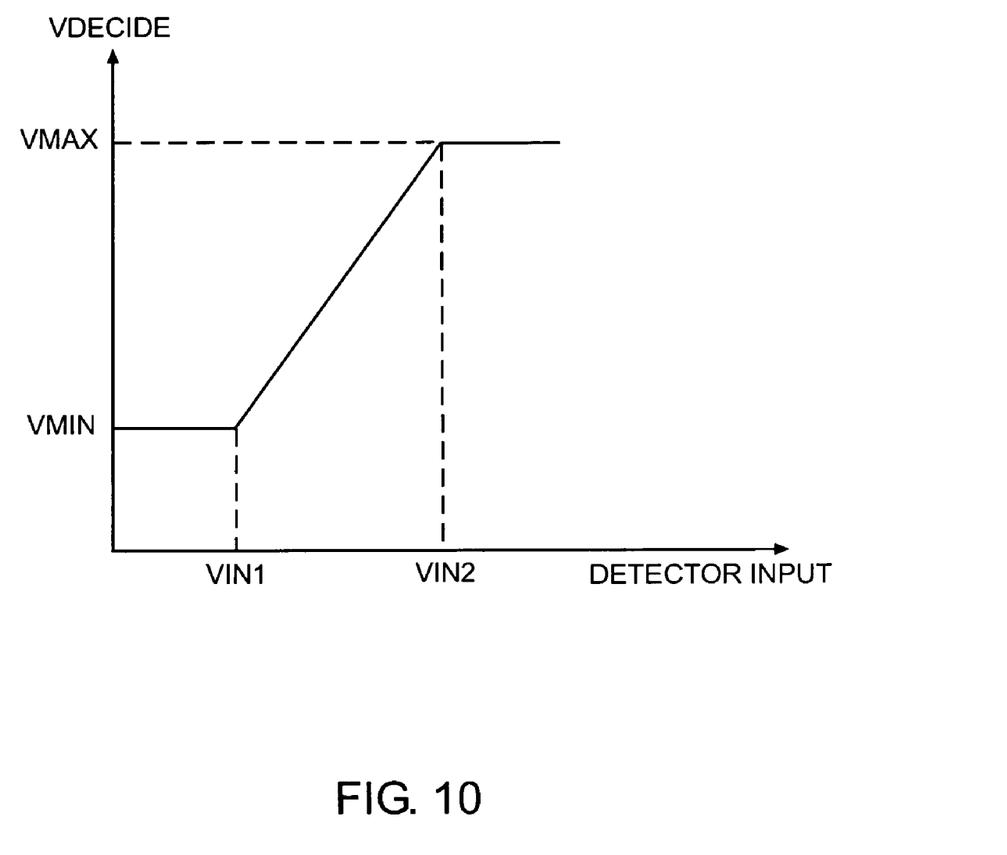
FIG. 10 shows the output response from the present invention, which is used to drive a DC to DC converter.

FIG. 10 shows the response of the bipolar power detector and decision circuit 92. If the detector input is less than VIN1, the primary side transistor 124 is in saturation; therefore, VDECIDE will be the value of VMIN. VMIN is determined by the value of VBIAS4 and the voltage drop across the primary side load resistor 128 due to the current being drawn by the primary side current source 130 and the common emitter resistor 132.

If the detector input is greater than VIN2, the primary side transistor 124 is off; therefore, VDECIDE will be the value of VMAX. VMAX is determined by the value of VBIAS4 since the voltage drop across the primary side load resistor 128 is virtually zero. In accordance with an alternative embodiment of the present invention, a control output signal may decrease as the RF input signal increases. Furthermore, the control output signal decreases no lower than a defined minimum value. In addition, the control output signal does not increase any higher than a defined maximum value in this embodiment.

The response of the power detector and decision circuit 72 when the detector input is between VIN1 and VIN2 can be adjusted by changing the value of the common emitter resistor 132.

Figure 11:
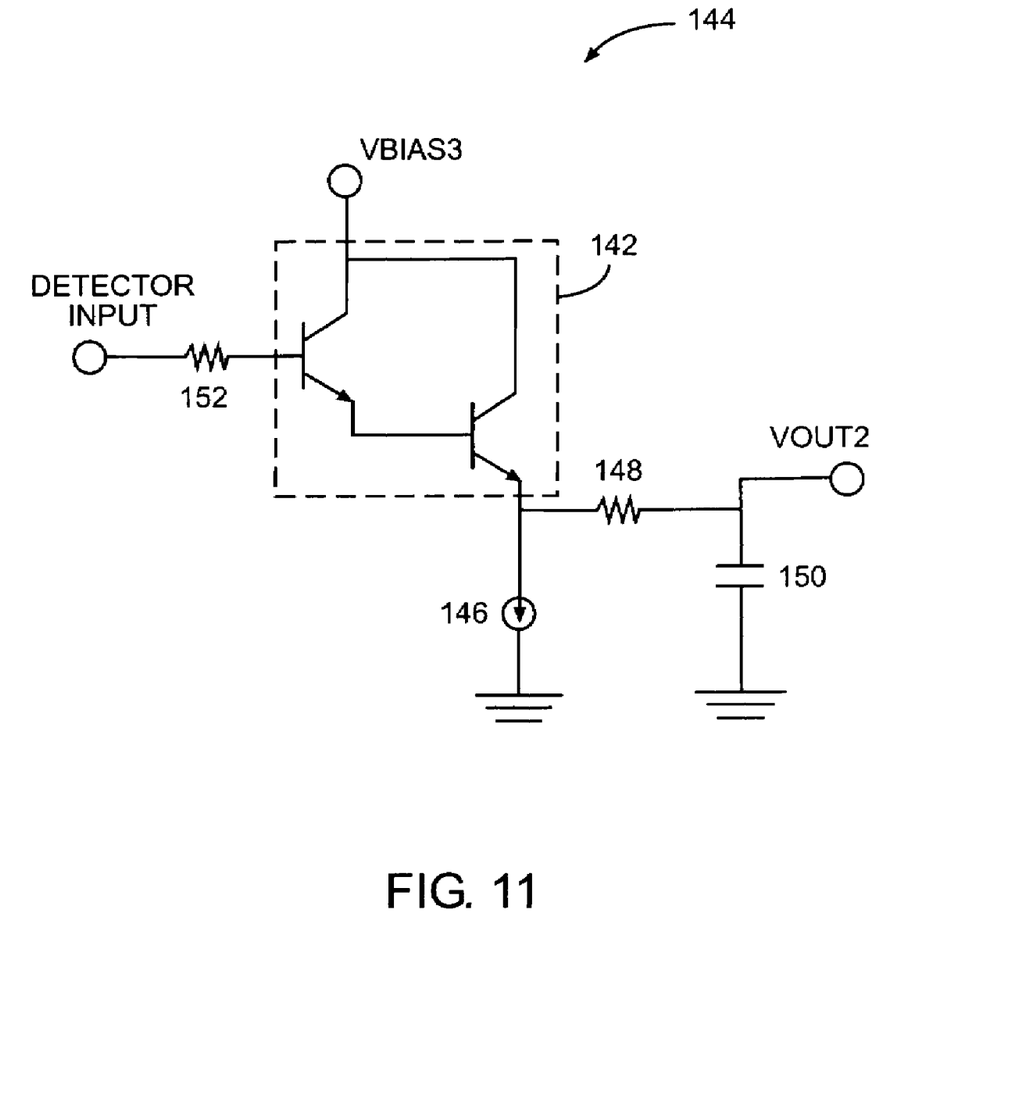
FIG. 11 shows a different embodiment of one of the amplifier elements of the present invention.

Another embodiment of the present invention, as shown in FIG. 11, is to modify the DC voltage level from the common collector amplifier 86 by using a darlington transistor 142. The darlington transistor 142 has two diode drops between its base and emitter instead of a single diode drop for a conventional bipolar transistor The darlington common collector amplifier 144 is comprised of the darlington transistor 142 whose emitter drives a darlington common collector amplifier current source 146 and a darlington common collector amplifier filter resistor 148. The collector of the darlington transistor 142 is connected to a DC supply voltage, called VBIAS3. The darlington common collector amplifier filter resistor 148 feeds a darlington common collector amplifier filter capacitor 150, which provides the common collector amplifier 86 DC output signal, called VOUT2. The detector input is fed to the base of the darlington transistor 142 through a darlington attenuator resistor 152.

Figure 12:
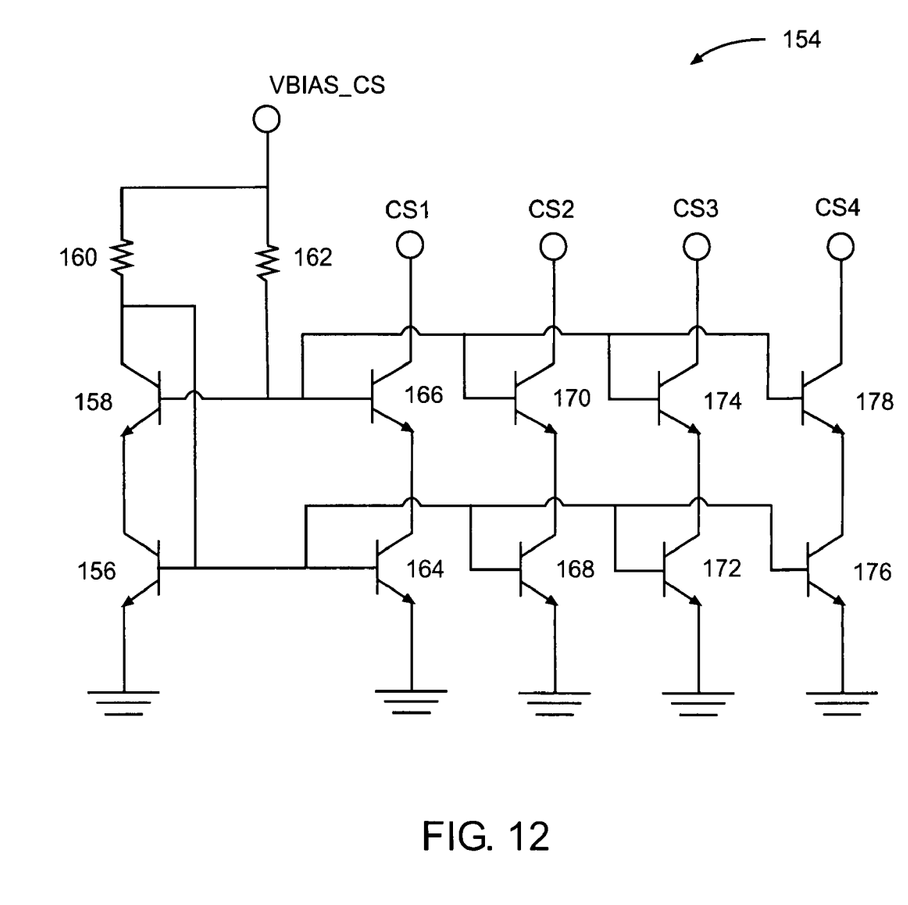
FIG. 12 shows a different embodiment of the current sources used in the present invention.

Another embodiment of the present invention is to use cascode type current sources for the common collector amplifier current source 116, the primary side current source 130, the secondary side current source 134, and the buffer current source 140 as shown in FIG. 12. Cascode current sources have higher output impedances and are less susceptible to temperature and process variations than many traditional current sources. The four current sources are provided by a four output current source 154 which uses a common current reference setpoint transistor 156 and a common bias transistor 158. The value of the output current of each of the current sources is determined by a current setpoint resistor 160, which feeds the bases of all of the setpoint transistors. A common bias resistor 162 feeds the bases of all of the bias transistors. Both resistors are fed with a DC voltage, called VBIAS_CS.

The common collector amplifier current source 116 is implemented using a common collector amplifier setpoint transistor 164 and a common collector amplifier bias transistor 166, which feeds the output of the current source, called CS1. The primary side current source 130 is implemented using a primary side setpoint transistor 168 and a primary side bias transistor 170, which feeds the output of the current source, called CS2. The secondary side current source 134 is implemented using a secondary side setpoint transistor 172 and a secondary side bias transistor 174, which feeds the output of the current source, called CS3. The buffer current source 140 is implemented using a buffer setpoint transistor 176 and a buffer bias transistor 178, which feeds the output of the current source, called CS4.

Figure 13:
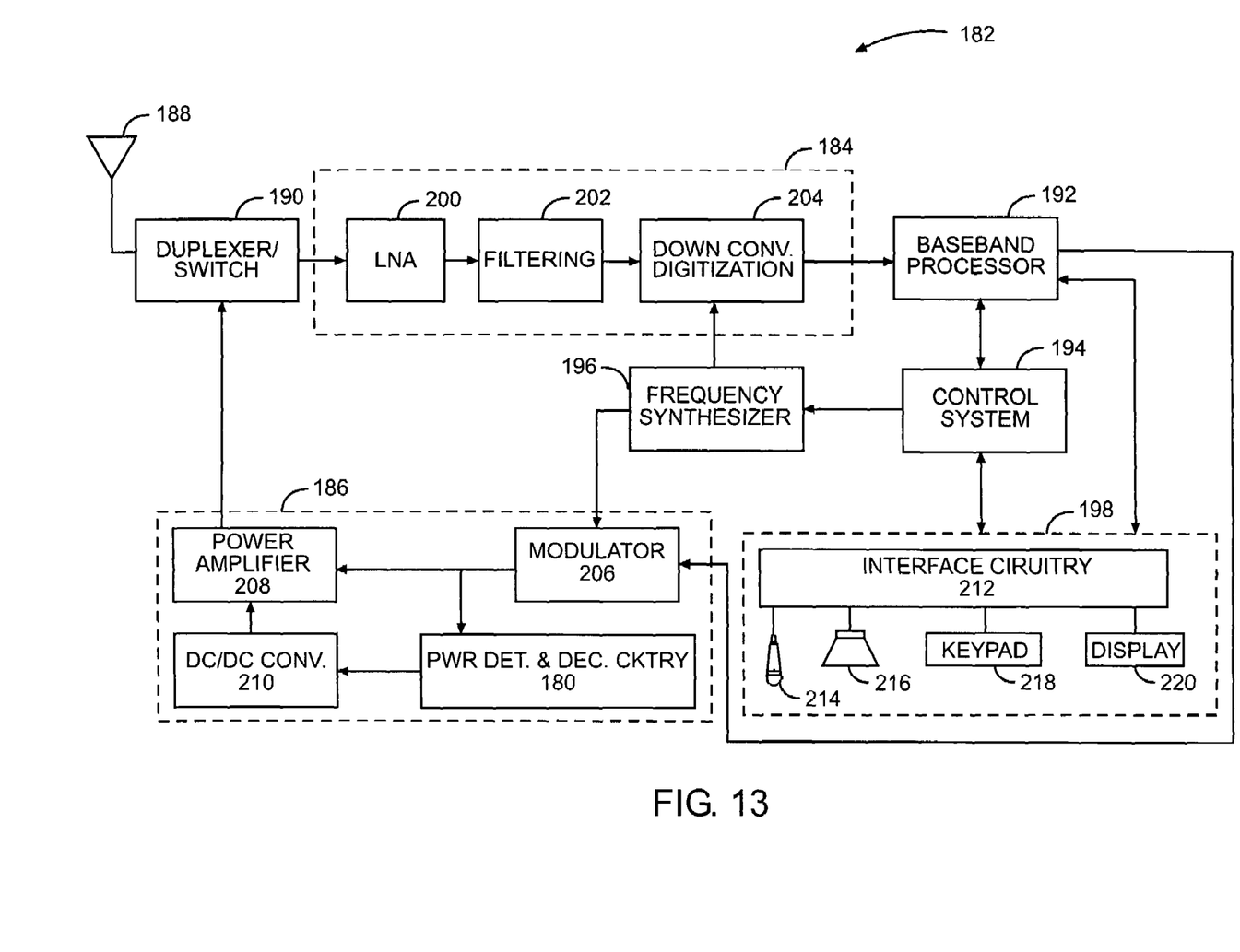
FIG. 13 shows an application of the invention used as a mobile terminal.

An application example of a power detector and decision circuit 180 is its use in a mobile terminal 182. The basic architecture of the mobile terminal 182 is represented in FIG. 13 and may include a receiver front end 184, a radio frequency transmitter section 186, an antenna 188, a duplexer or switch 190, a baseband processor 192, a control system 194, a frequency synthesizer 196, and an interface 198. The receiver front end 184 receives information bearing radio frequency signals from one or more remote transmitters provided by a base station. A low noise amplifier (LNA) 200 amplifies the signal. A filter circuit 202 minimizes broadband interference in the received signal, while downconversion and digitization circuitry 204 downconverts the filtered, received signal to an intermediate or baseband frequency signal, which is then digitized into one or more digital streams. The receiver front end 184 typically uses one or more mixing frequencies generated by the frequency synthesizer 196. The baseband processor 192 processes the digitized received signal to extract the information or data bits conveyed in the received signal. This processing typically comprises demodulation, decoding, and error correction operations. As such, the baseband processor 192 is generally implemented in one or more digital signal processors (DSPs). The downconversion and digitization circuitry 204 measures the strength of the received signal and selects the appropriate mode of operation for the LNA 200.

On the transmit side, the baseband processor 192 receives digitized data, which may represent voice, data, or control information, from the control system 194, which it encodes for transmission. The encoded data is output to the transmitter 186, where it is used by a modulator 206 to modulate a carrier signal that is at a desired transmit frequency. Power amplifier circuitry 208 amplifies the modulated carrier signal to a level appropriate for transmission, and delivers the amplified and modulated carrier signal to the antenna 188 through the duplexer or switch 190. The power detector and decision circuit 180 measures the magnitude of the modulated carrier signal and sends a control voltage to a DC to DC converter 210, which applies the proper DC supply voltage to the power amplifier circuitry 208.

A user may interact with the mobile terminal 182 via the interface 198, which may include interface circuitry 212 associated with a microphone 214, a speaker 216, a keypad 218, and a display 220. The interface circuitry 198 typically includes analog-to-digital converters, digital-to-analog converters, amplifiers, and the like. Additionally, it may include a voice encoder/decoder, in which case it may communicate directly with the baseband processor 192. The microphone 214 will typically convert audio input, such as the user's voice, into an electrical signal, which is then digitized and passed directly or indirectly to the baseband processor 192. Audio information encoded in the received signal is recovered by the baseband processor 192, and converted by the interface circuitry 198 into an analog signal suitable for driving the speaker 216. The keypad 218 and display 220 enable the user to interact with the mobile terminal 182, input numbers to be dialed, address book information, or the like, as well as monitor call progress information.

Those skilled in the art will recognize improvements and modifications to the embodiments of the present invention. All such improvements and modifications are considered within the scope of the concepts disclosed herein and the claims that follow.

What is claimed is:

1. A power detector and decision circuit comprising:
   a non-inverting RF detector circuit operable to:
      receive an RF input signal; and
      provide a non-inverting detector output signal that is a DC representation of the RF input signal such that the non-inverting detector output signal increases as the RF input signal increases; and
   an inverting RF detector circuit operable to:
      receive the RF input signal; and
      provide an inverting detector output signal that is a DC representation of the RF input signal such that the inverting detector output signal decreases as the RF input signal increases; and
   a differential input amplifier operable to:
      receive the non-inverting detector output signal and the inverting detector output signal; and
      provide a control output signal that changes in relation to the RF input signal.

2. The power detector and decision circuit of claim 1 wherein the control output signal increases as the RF input signal increases.

3. The power detector and decision circuit of claim 2 wherein the control output signal increases no higher than a defined maximum value.

4. The power detector and decision circuit of claim 2 wherein the control output signal decreases no lower than a defined minimum value.

5. The power detector and decision circuit of claim 1 wherein the control output signal decreases as the RF input signal increases.

6. The power detector and decision circuit of claim 5 wherein the control output signal increases no higher than a defined maximum value.

7. The power detector and decision circuit of claim 5 wherein the control output signal decreases no lower than a defined minimum value.

8. The power detector and decision circuit of claim 1 adapted to receive the RF input signal from an output of a power amplifier.

9. The power detector and decision circuit of claim 1 adapted to receive the RF input signal from an output of an amplifier stage feeding a power amplifier.

10. The power detector and decision circuit of claim 1 further comprising:
    a first resistive attenuator circuit coupling the RF input signal to the non-inverting RF detector circuit; and
    a second resistive attenuator circuit coupling the RF input signal to the inverting RF detector circuit.

11. The power detector and decision circuit of claim 1 wherein the non-inverting RF detector circuit further comprises:
    a non-inverting detector transistor circuit comprising:
        a non-inverting detector input adapted to receive the RF input signal; and
        a non-inverting detector transistor output;
    a non-inverting detector current source coupled to the non-inverting detector transistor output;
    a non-inverting detector resistive element coupled between the non-inverting detector transistor output and a non-inverting detector output wherein the non-inverting detector output provides the non-inverting detector output signal; and
    a non-inverting detector capacitive element coupled to the non-inverting detector output wherein the non-inverting detector resistive element and the non-inverting detector capacitive element filter RF signals such that the non-inverting detector output signal is a DC representation of the RF input signal.

12. The power detector and decision circuit of claim 11 wherein the non-inverting detector transistor circuit is a darlington transistor configuration.

13. The power detector and decision circuit of claim 11 wherein the non-inverting detector current source further comprises at least two transistors in a cascode configuration.

14. The power detector and decision circuit of claim 1 wherein the inverting RF detector circuit further comprises:
    an inverting detector transistor circuit comprising:
        an inverting detector input adapted to receive the RF input signal; and
        an inverting detector transistor output;
    an inverting detector current source coupled to the inverting detector transistor output;
    an inverting detector resistive element coupled between the inverting detector transistor output and an inverting detector output wherein the inverting detector output provides the inverting detector output signal; and
    an inverting detector capacitive element coupled to the inverting detector output wherein the inverting detector resistive element and the inverting detector capacitive element filter RF signals such that the inverting detector output signal is a DC representation of the RF input signal.

15. The power detector and decision circuit of claim 1 wherein the differential input amplifier further comprises:
    an inverting differential transistor circuit comprising:
        an inverting differential input adapted to receive the inverting detector output signal;

an inverting differential current input; and
an inverting differential output;
a non-inverting differential transistor circuit comprising:
a non-inverting differential input adapted to receive the non-inverting detector output signal;
a non-inverting differential current input; and
a non-inverting differential output;
an inverting differential current source coupled to the inverting differential current input;
a non-inverting differential current source coupled to the non-inverting differential current input; and
a differential resistive element coupled between the inverting differential current input and the non-inverting differential current input such that the differential resistive element affects the relationship between the RF input signal and the control output signal;
wherein the control output signal is provided by adapting to either the inverting differential output or the non-inverting differential output.

16. The power detector and decision circuit of claim 15 wherein the inverting differential current source further comprises at least two transistors in a cascode configuration.

17. The power detector and decision circuit of claim 15 wherein the non-inverting differential current source further comprises at least two transistors in a cascode configuration.

18. The power detector and decision circuit of claim 1 further comprising:
a control output buffer circuit adapted to:
receive the control output signal; and
provide a buffered control output signal, which follows the control output signal.

19. The power detector and decision circuit of claim 18 wherein the control output buffer further comprises:
a control output buffer transistor circuit comprising:
a control output buffer input adapted to receive the control output signal;
a buffered control output; which provides the buffered control output signal; and
a control output buffer current source coupled to the buffered control output.

20. The power detector and decision circuit of claim 19 wherein the control output buffer current source further comprises at least two transistors in a cascode configuration.

* * * * *